US012193170B2

(12) United States Patent
Hyun et al.

(10) Patent No.: US 12,193,170 B2
(45) Date of Patent: Jan. 7, 2025

(54) DISPLAY DEVICE

(71) Applicant: Samsung Display Co., LTD., Yongin-si (KR)

(72) Inventors: Min Gwan Hyun, Yongin-si (KR); Hyun Hyang Kim, Yongin-si (KR); Jeong Weon Seo, Yongin-si (KR); Jun Hee Son, Yongin-si (KR); Da Hye Kim, Yongin-si (KR); Jae Sul An, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 46 days.

(21) Appl. No.: 17/690,167

(22) Filed: Mar. 9, 2022

(65) Prior Publication Data
US 2023/0007792 A1 Jan. 5, 2023

(30) Foreign Application Priority Data

Jul. 1, 2021 (KR) .......................... 10-2021-0086633

(51) Int. Cl.
H05K 5/00 (2006.01)
H05K 5/02 (2006.01)

(52) U.S. Cl.
CPC ......... H05K 5/0021 (2013.01); H05K 5/0217 (2013.01)

(58) Field of Classification Search
CPC ... H05K 5/0217; H05K 5/0021; H05K 5/0017
See application file for complete search history.

(56) References Cited

U.S. PATENT DOCUMENTS

| 7,926,213 | B1* | 4/2011 | Kludt | H05K 5/0204 40/605 |
| 8,797,234 | B2 | 8/2014 | Watanabe et al. | |
| 8,929,083 | B2* | 1/2015 | Cox | F16M 11/00 361/756 |
| 9,477,438 | B1* | 10/2016 | Hochman | H01R 13/665 |
| 9,761,157 | B2* | 9/2017 | Cox | G09F 15/0037 |
| 9,830,885 | B2* | 11/2017 | Cross | G06F 3/1446 |

(Continued)

FOREIGN PATENT DOCUMENTS

| JP | 5378569 | 12/2013 |
| KR | 10-0580824 | 5/2006 |

(Continued)

OTHER PUBLICATIONS

Translation of CN 205487173 (Year: 2024).*

Primary Examiner — Sagar Shrestha
(74) Attorney, Agent, or Firm — KILE PARK REED & HOUTTEMAN PLLC

(57) ABSTRACT

A display device includes: a first display panel; a first housing disposed on the bottom of the first display panel; a first cabinet disposed on the bottom of the first housing, the first cabinet including a first protrusion part and a first concave part; and a first side frame disposed on a side surface of the first display panel. The first side frame is movable toward the first cabinet, and a portion of the first side frame extends to the first concave part. Thus, there may be provided a display device which may be independently used and also be used to constitute (or form) a tiling display device by connecting multiple display devices.

10 Claims, 9 Drawing Sheets

(56) References Cited

U.S. PATENT DOCUMENTS

| | | | | |
|---|---|---|---|---|
| 9,845,816 | B2* | 12/2017 | Brashnyk | F16M 13/022 |
| 9,864,561 | B2* | 1/2018 | Hochman | H01R 25/00 |
| 10,018,343 | B2* | 7/2018 | Wasserman | F21V 23/0435 |
| 10,667,411 | B2* | 5/2020 | Shin | G02F 1/133308 |
| 11,006,534 | B2 | 5/2021 | Kim et al. | |
| 11,288,028 | B2* | 3/2022 | Miles | H02J 7/35 |
| 11,470,731 | B1* | 10/2022 | Hochman | H05K 5/0021 |
| 2010/0321917 | A1* | 12/2010 | Kim | H04N 9/12 |
| | | | | 361/829 |
| 2011/0057215 | A1* | 3/2011 | Chen | G09F 7/002 |
| | | | | 257/E33.056 |
| 2013/0293443 | A1* | 11/2013 | Seo | G06F 3/1446 |
| | | | | 345/1.2 |
| 2016/0210886 | A1* | 7/2016 | Brashnyk | F16B 5/02 |
| 2017/0159876 | A1* | 6/2017 | Brashnyk | F16M 13/02 |
| 2020/0058238 | A1* | 2/2020 | Davis | G09F 11/025 |

FOREIGN PATENT DOCUMENTS

| | | |
|---|---|---|
| KR | 10-2020-0072789 | 6/2020 |
| KR | 10-2130040 | 8/2020 |
| KR | 10-2020-0134788 | 12/2020 |

* cited by examiner

DISPLAY DEVICE

CROSS-REFERENCE TO RELATED APPLICATION(S)

The present application claims priority to and benefits of Korean patent application 10-2021-0086633 under 35 U.S.C. § 119, filed in the Korean Intellectual Property Office on Jul. 1, 2021, the entire contents of which are incorporated herein by reference.

BACKGROUND

1. Technical Field

The disclosure generally relates to a display device, which may be independently used and also used to constitute a tiling display device by connecting multiple display devices.

2. Description of Related Art

As interest in information displays and demand for portable information media increase, research and commercialization have focused on display devices.

Such display devices have been manufactured and used in various sizes from display devices having relatively small sizes, such as TVs, monitors, and various types of personal portable digital devices to display devices having relatively large sizes, such as public displays and digital signage.

However, technical difficulty exists up to now when independent large-sized display devices are manufactured. Accordingly, a tiling display device has recently been used, in which display devices are connected to each other, thereby enlarging a display area.

A boundary area of the display devices should be minimized so as to improve the visibility of the tiling display device, the quality of an image, and the like, and hence each of the display devices has no instrument capable of protecting corners thereof. Therefore, the display device may be damaged from a very weak contact, and hence it is difficult to handle the display device. In addition, the display device cannot be used even when the display device is to be independently used without constituting the tiling display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device which facilitates panel handling when the display device is independently used and has improved visibility when the display device constitutes a tiling display device, to be independently used and also be used to constitute the tiling display device when multiple display devices are connected.

In accordance with an aspect of the disclosure, there is provided a display device including: a first display panel; a first housing disposed on a bottom of the first display panel; a first cabinet disposed on a bottom of the first housing, the first cabinet including a first protrusion part and a first concave part; and a first side frame disposed on a side surface of the first display panel, wherein the first side frame is movable toward the first cabinet, and a portion of the first side frame extends to the first concave part.

The display device may further include: a second display panel disposed adjacent to the first display panel; a second housing disposed on a bottom of the second display panel; a second cabinet disposed on a bottom of the second housing, the second cabinet including a second protrusion part and a second concave part; and a second side frame disposed on a side surface of the second display panel. The second side frame may be movable toward the second cabinet, and a portion of the second side frame may extend to the second concave part.

The first side frame may cover the side surface of the first display panel and protect the first display panel, and the second side frame may cover the side surface of the second display panel and protect the second display panel.

At least one first protrusion part and at least one first concave part may be disposed on at least one side surface of the first cabinet, and at least one second protrusion part and at least one second concave part may be disposed on at least one side surface of the second cabinet.

The first concave part may include a connection part and a control part. The connection part may be connected to the first side frame and movable in a direction. The connection part may include an inclined surface corresponding to the second protrusion part. The control part may be fastened to the connection part to control movement of the connection part.

The control part may include a spring having elasticity.

The first protrusion part may protrude toward the second concave part, and the second protrusion part may protrude toward the first concave part.

In case that the first display panel and the second display panel are connected to each other, the first protrusion part may be moved to an inside of the second concave part, and the second protrusion part may be moved to an inside of the first concave part.

In case that the first display panel and the second display panel are connected to each other, the second protrusion part may move to the first concave part, contact the inclined surface of the connection part, and applies a force to the control part such that the control part is moved in the direction.

In case that the first display panel and the second display panel are connected to each other, each of the first and second side frames may be moved toward a corresponding one of the first and second cabinets.

A thickness of the second protrusion part may be greater than that of the second side frame.

The first concave part may include a moving part, a first control part, a connection part, and a second control part. The moving part may be movable in a direction. The first control part may be fastened to the moving part to control movement of the moving part. The connection part may be connected to the first side frame to be movable in another direction different from the direction. The second control part may be fastened to the connection part to control movement of the connection part. Each of the first control part and the second control part may include a spring having elasticity.

A thickness of the second protrusion part may be equal to a thickness of the second side frame.

In case that the first display panel and the second display panel are connected to each other, the second protrusion part may move to the moving part and apply a force to the moving part such that the first control part is moved in in the direction.

The connection part and the second control part may be moved in another direction different from the direction, in case that the first control part is moved in the direction.

The first cabinet may be smaller than the first display panel. The first side frame may have a stepped shape.

The first concave part may include a connection part, a moving part and a control part. The connection part may be connected to the first side frame, and include a third protrusion part protruding toward the second side frame. The moving part may be connected to the connection part. The control part may be fastened to the moving part to control movement of the moving part. The control part may include a spring having elasticity.

The second protrusion part may protrude toward the third protrusion part and the moving part. The moving part may include an inclined surface corresponding to the second protrusion part.

In case that the first display panel and the second display panel are connected to each other, the second protrusion part may contact the third protrusion part and the inclined surface of the moving part and move the control part in a direction through pressure fastening between the second protrusion part and the moving part.

Each of the first side frame and the second side frame is moved toward a corresponding one of the first and second cabinets.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
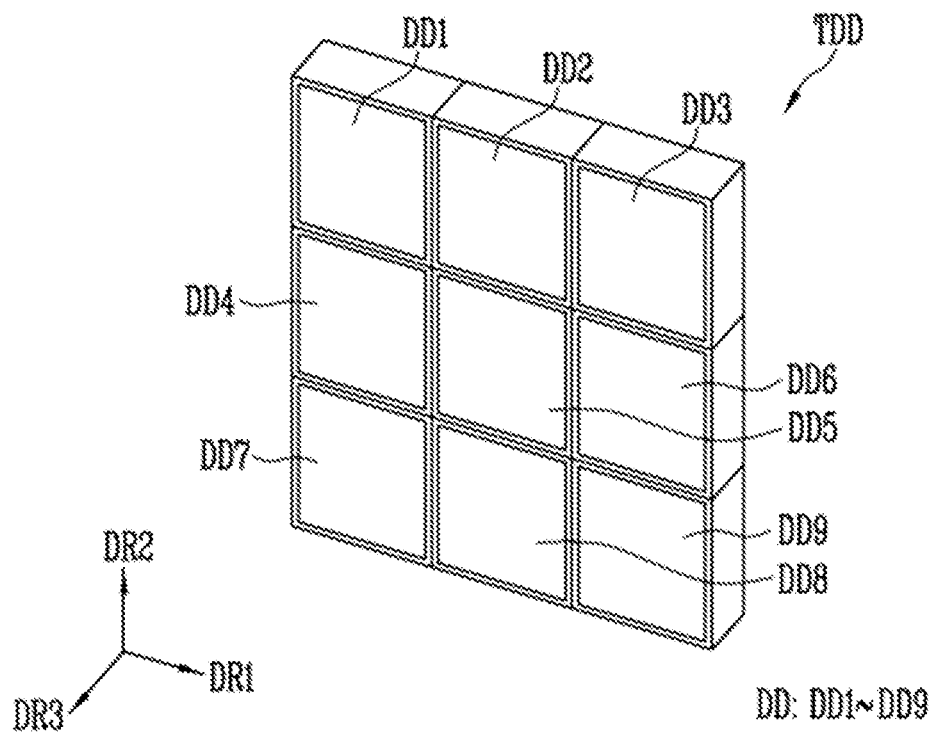
FIG. 1 is a perspective view schematically illustrating a tiling display device in accordance with an embodiment of the disclosure.

The disclosure may apply various changes and different shape, therefore only illustrate in detail with particular examples. However, the examples are not limited to certain shapes but apply to all the change and equivalent material and replacement. The drawings included are illustrated a fashion where the figures are expanded for the better understanding.

Like numbers refer to like elements throughout. In the drawings, sizes and the thickness of lines, layers, components, elements or features may be exaggerated for clarity. It will be understood that, although the terms "first," "second," and the like may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be further understood that when the terms "comprises," "comprising," "includes," and/or "including" are used in this specification, they or it may specify the presence of stated features, integers, steps, operations, elements, and/or components, but do not preclude the presence and/or addition of one or more other features, integers, steps, operations, elements, components, and/or any combination thereof.

Further, in the specification, the phrase "in a plan view" means when an object portion is viewed from above, and the phrase "in a cross-sectional view" means when a cross-section taken by vertically cutting an object portion is viewed from the side.

Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

It will be understood that the terms "contact," "connected to," and "coupled to" may include a physical and/or electrical contact, connection, or coupling, and vice versa.

Unless otherwise defined or implied herein, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal excessively formal sense unless clearly defined in the specification.

Figure 2:
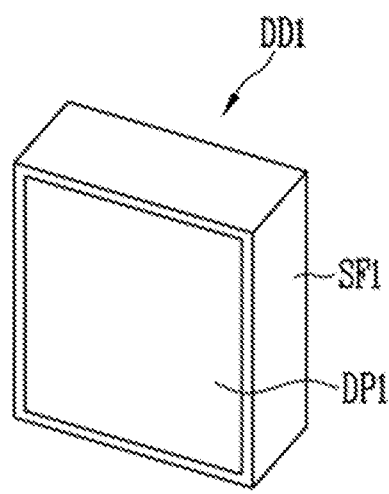
FIG. 2 is a perspective view schematically illustrating a first display device among display devices constituting the tiling display device shown in FIG. 1.

FIG. 1 is a perspective view schematically illustrating a tiling display device TDD in accordance with an embodiment of the disclosure. FIG. 2 is a perspective view schematically illustrating a first display device DD1 among display devices DD (DD1 to DD9) constituting the tiling display device TDD shown in FIG. 1.

Referring to FIGS. 1 and 2, the display device in accordance with the embodiment of the disclosure may be a tiling display device TDD including display devices DD.

The disclosure may be applied as long as the display device DD is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

The tiling display device TDD (or also referred to as a multi-screen display device) may include a plurality of display devices DD arranged in a matrix form in a first direction DR1 and a second direction DR2. The second direction DR2 may intersect the first direction DR1. The matrix form may include at least one row and at least two columns.

The display devices DD may include, for example, a first display device DD1, a second display device DD2, a third display device DD3, a fourth display device DD4, a fifth display device DD5, a sixth display device DD6, a seventh display device DD7, an eighth display device DD8, and a ninth display device DD9.

The display devices DD may be disposed and engaged (e.g., interlocked or intermeshed) with each other in the first direction DR1, to implement the tiling display device TDD. The display devices DD may be arranged in a matrix form. The matrix form may include at least one row and at least two columns.

The display devices DD may display individual images or divisionally display an image. For example, the display devices DD may display a same image or different images from each other, or images displayed on the display devices DD may be combined to display one large image. The display devices DD may include the same kind, structure, size or type of display panels, but the disclosure is not limited thereto.

The display devices DD may be arranged side by side such that each display surface (or image display surface) thereof on which an image is displayed faces in a direction (e.g., a third direction DR3). The display devices DD may have the same size (or area), but the disclosure is not limited thereto. In another embodiment, each of the display devices DD may have a size (or area) different from those of adjacent display devices DD to correspond to design conditions or the like of the tiling display device TDD applied thereto.

The display devices DD may be provided in (or provided as) various shapes. In an example, the display devices DD may be provided in a rectangular plate shape having two pairs of sides parallel to each other, but the disclosure is not limited thereto. In case that the display devices DD are provided in the rectangular plate shape, any one pair of sides among the two pairs of sides may be provided longer than another pair of sides. In the embodiment of the disclosure, the display devices DD may be provided in (or have) a square shape having sides with the same length, but the disclosure is not limited thereto.

Although a case where the plurality of display devices DD have an angular corner portion configured with straight lines has been illustrated in the drawings of the disclosure, the disclosure is not limited thereto. For example, the display devices DD provided in (or have) a quadrangular plate shape may have a round corner portion at which one side and another contact each other.

In an embodiment of the disclosure, at least a portion of the display devices DD may have flexibility, and the display devices DD may be folded at the portion having the flexibility.

In some embodiments, the display devices DD may include a sensing area and a non-sensing area. The display devices DD may display an image through the sensing area, and sense a touch input (or touch event) made on a display surface (or input surface) or light incident from the front. For example, the display devices DD may include a sensing element (not illustrated) such as a touch sensor, a touch screen panel, a photo sensor, or the like in the sensing area to sense the touch input or the incident light. The non-sensing area may surround the sensing area. However, this is merely illustrative, and the disclosure is not limited thereto.

The first to ninth display devices DD1 to DD9 may have substantially identical or similar structure to one another. Hereinafter, for convenience, descriptions of the first display device DD1 among the first to ninth display devices DD1 to DD9 are provided below.

As shown in FIG. 2, the first display device DD1 may include a first display panel DP1 and a first side frame SF1.

The first display panel DP1 may be disposed in the uppermost layer of the first display device DD1.

The first display panel DP1 may display an image. The first display panel DP1 may be (or include) a self-luminescent (or self-emissive) display panel, such as an organic light emitting display (OLED) panel including an organic light emitting diode as a light emitting element, a nano-scale light emitting diode (LED) display panel including a nano-scale LED as a light emitting element, a quantum dot organic light emitting display (QD OLED) panel using a quantum dot and an organic light emitting diode, or the like.

The first display panel DP1 may be a non-self-luminescent (or non-emissive) display panel, such as a liquid crystal display panel (LCD panel), an electro-phoretic display panel (EPD panel), an electro-wetting display panel (EWD), or the like. In case that a non-self-luminescent display panel is used as the first display panel DP1, the first display device DD1 may include a back light unit for supplying light to the first display panel DP1.

A window (not shown) protecting an exposed surface of the first display panel DP1 may be provided on the first display panel DP1. The window may protect the first display panel DP1 from external impact, and provide a user with an input surface and/or a display surface. The window may be coupled to (or combined with) the first display panel DP1 by using an adhesive member, e.g., an optically clear (or transparent) adhesive member, an optically transparent gluing member, an optically transparent attachable (or detachable) member, or the like.

The window may have a multi-layered structure including at least one selected from a glass substrate, a plastic film, and a plastic substrate. The multi-layered structure may be formed through a continuous process or an adhesion process using an adhesive layer. The entire or a portion of the window may have flexibility.

A touch sensor (not shown) may be disposed between the first display panel DP1 and the window. The touch sensor may be disposed directly on the display surface of the first display panel DP1 on which the image is displayed to receive a touch input (or touch event) of a user. In the embodiment of the disclosure, "being directly disposed" may mean when an element is formed on another element through a continuous process without a separate adhesive layer (or gluing layer).

The first side frame SF1 may be disposed on a side surface of the first display panel DP1. Although a case where the first side frame SF1 is disposed on each of four side surfaces of the first display panel DP1 is illustrated in the disclosure, the first side frame SF1 may be disposed only on some of the four side surfaces. However, the disclosure is not limited thereto.

The first side frame SF1 may cover (or overlap) the first display panel DP1 and protect the first display panel DP1. For example, the first side frame may protect the first display panel DP1 from external impact applied to the first display panel DP1, thereby minimizing damage of the first display panel DP1.

The first side frame SF1 may protect a corner (or edge) portion of the first display panel DP1 and protect the first display panel DP1 which is weak (or vulnerable) to impact or damage. The first side frame SF1 may minimize damage of the first display panel DP1 due to impact, friction, or the like, which is applied to the side surface of the first display panel DP1.

The first display device DD1 including the first side frame SF1 may be used as an independent display device. For example, in the first display device DD1 including the first side frame SF1, chippings or cracks, which exist at the display surface, are minimized, so that the first display device DD1 can be used as an independent display device.

Since the above-described first display device DD1 includes the first side frame SF1, the first display device DD1 may be sufficiently used as an independent display device even in case that a separate process for protecting the side surface of the first display panel DP1 (e.g., a process of chamfering the side surface of the first display panel DP1) is not performed.

Figure 3:
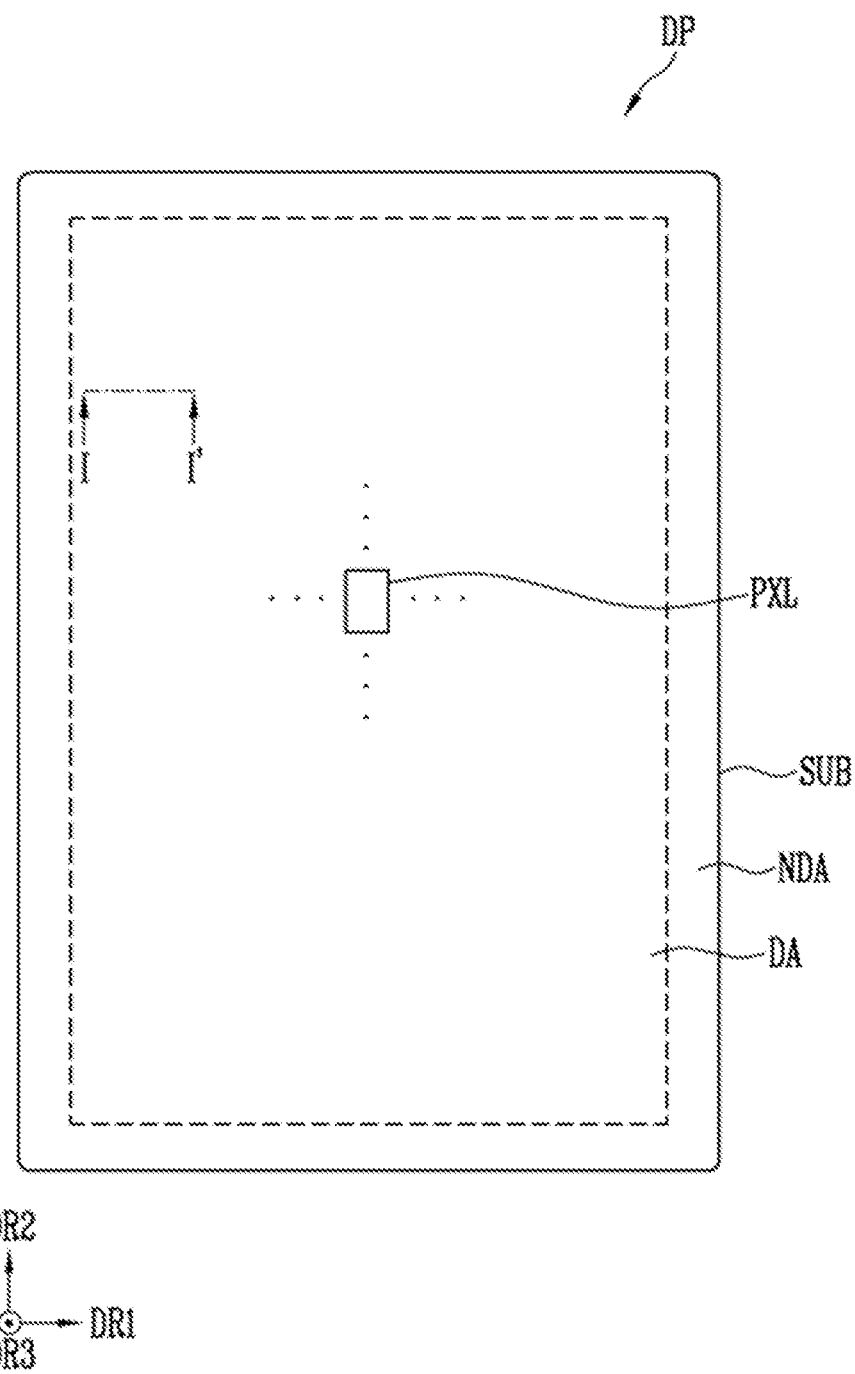
FIG. 3 is a plan view schematically illustrating a display panel in accordance with an embodiment of the disclosure.

FIG. 3 is a plan view schematically illustrating a display panel DP in accordance with an embodiment of the disclosure.

Referring to FIG. 3, the display panel DP in accordance with the embodiment of the disclosure may include a substrate SUB.

The substrate SUB may have an approximately rectangular shape. However, the number of areas provided in the substrate SUB may be different from the above-described example, and the substrate SUB may have different shapes according to an area provided in the substrate SUB.

The substrate SUB may be made of an insulative material (or insulating material) such as glass, resin, or the like. The substrate SUB may be made of (or include) a material having flexibility to be bendable or foldable, and have a single-layered structure or a multi-layered structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the material constituting the substrate SUB is not limited thereto.

The substrate SUB may include a display area DA and a non-display area NDA.

The display area DA may be an area in which pixels PXL are provided to display an image. For convenience of description, only one pixel PXL is illustrated in FIG. 3, but multiple pixels PXL may be disposed in the display area DA.

The pixels PXL may be provided (or disposed) in the display area DA. Each of the pixels PXL may be a minimum unit for displaying an image. Each of the pixels PXL may include a light emitting element emitting white light and/or colored light. Each of the pixels PXL may emit light of any one color among red, green, and blue. However, the disclosure is not limited thereto, and each of the pixels PXL may emit light of a color such as cyan, magenta, yellow or the like.

The pixels PXL may be arranged in rows extending in a first direction DR1 and columns extending in a second direction DR2 intersecting the first direction DR1. However, the arrangements of the pixels PXL is not particularly limited, and the pixels PXL may be arranged in various forms. Although a case where the pixels PXL have a rectangular shape has been illustrated in FIG. 3, the disclosure is not limited thereto, and the pixels PXL may be modified in various shapes. In case that multiple pixels PXL are provided, the pixels PXL may have different areas (or sizes). For example, in case that pixels PXL having different colors of light emitted therefrom are provided, the pixels PXL may have different areas (or sizes) or different shapes with respect to the colors.

The non-display area NDA may be provided on at least one side of the display panel DP. However, the disclosure is not limited thereto. In another embodiment, shapes of the display area DA and the non-display area NDA may be designed with respect to each other.

A driving unit (not shown) for driving the pixels PXL and some of lines (not shown), which connect (e.g., electrically connect) the pixels PXL and the driver to each other, may be provided (or disposed) in the non-display area NDA.

Figure 4:
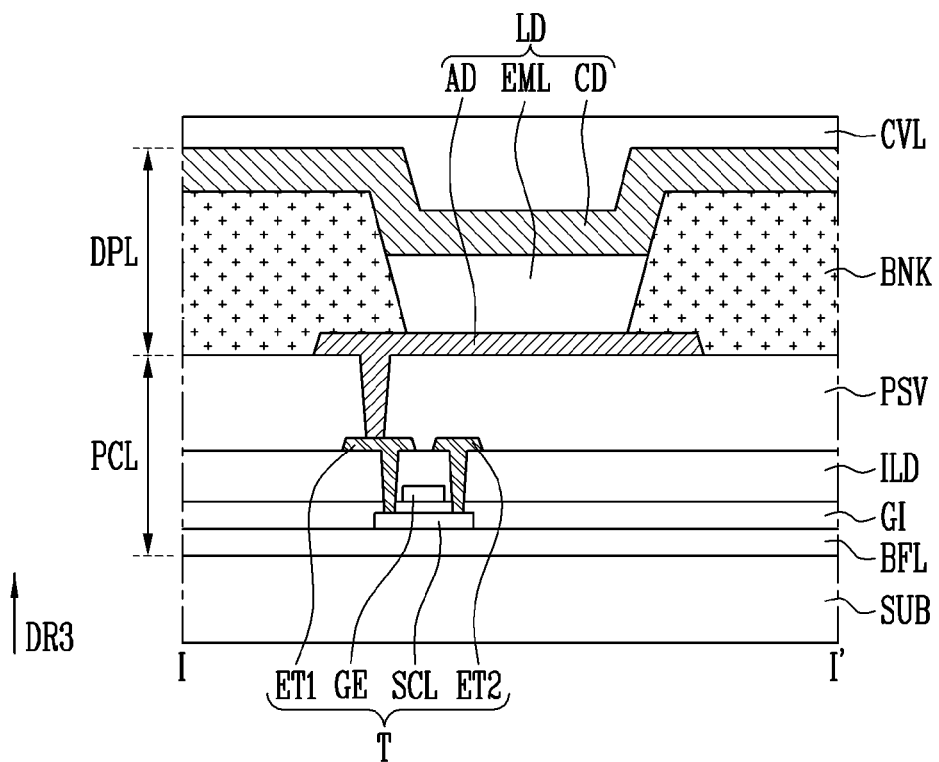
FIGS. 4 and 5 are schematic cross-sectional views schematically illustrating the display panel taken along line I-I' shown in FIG. 3.
Figure 5:
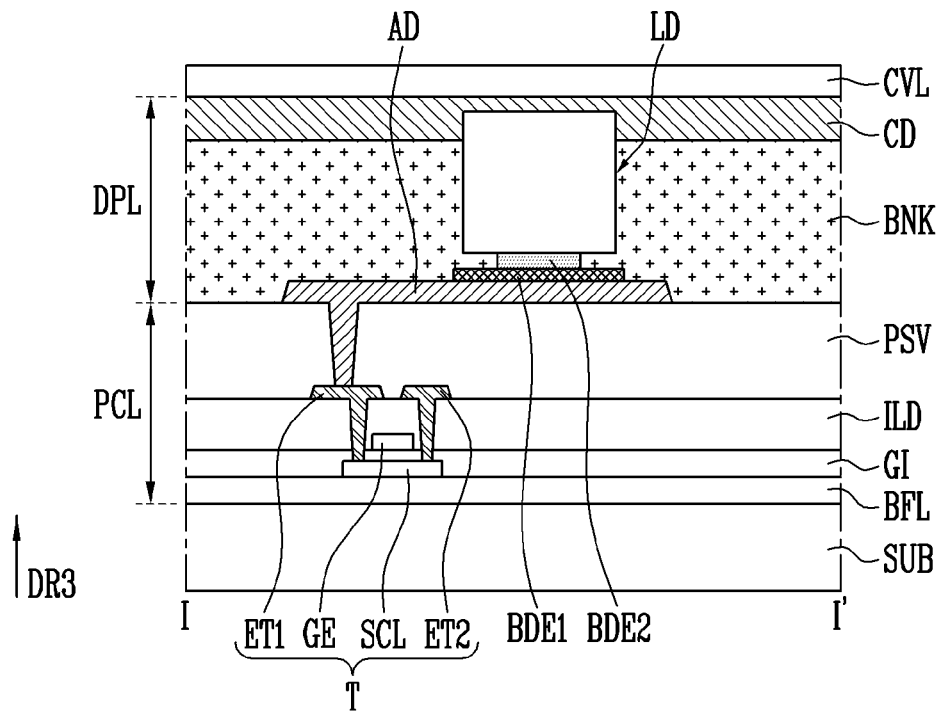

FIGS. 4 and 5 are cross-sectional views schematically illustrating the display panel DP taken along line I-I' shown in FIG. 3.

In FIGS. 4 and 5, the structure of the display panel DP is simplified and illustrated, such as a case where each electrode is illustrated as only a single-layered electrode and a case where each insulating layer is illustrated as only a single-layered insulating layer. However, the disclosure is not limited thereto.

In an embodiment of the disclosure, the term "being formed and/or provided on the same layer" may mean being formed by the same process, and the term "being formed and/or provided on different layers" may mean being formed in different processes.

In an embodiment of the disclosure, the term "connection" between two components may include both electrical connection and/or physical connection.

Referring to FIGS. 3 to 5, the display panel DP in accordance with the embodiment of the disclosure may include the substrate SUB, a pixel circuit layer PCL, and a display element layer DPL.

The pixel circuit layer PCL may be disposed on the substrate SUB.

The pixel circuit layer PCL may include a buffer layer BFL, at least one transistor T provided on the buffer layer BFL, and a protective layer PSV provided over the transistor T.

The buffer layer BFL may be provided and/or formed on a surface of the substrate SUB. The buffer layer BFL may prevent an impurity from being diffused into the transistor T. The buffer layer BFL may be an inorganic insulating layer including an inorganic material. The buffer layer BFL may include, for example, at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in a single layer. However, the buffer layer BFL is not limited thereto, and may be provided in a multi-layer including at least two layers. In case that the buffer layer BFL is provided in the multi-layer, the layers may be formed of the same material or be formed of different materials. The buffer layer BFL may be omitted according to the material and process conditions of the substrate SUB.

At least one transistor T and signal lines connected to the transistor T may be disposed on the buffer layer BFL.

The transistor T may have a form in which a semiconductor layer SCL, a gate electrode GE, and source/drain electrodes are stacked (e.g., sequentially stacked) with an insulating layer disposed (or interposed) therebetween. For example, the transistor T may include the semiconductor layer SCL, the gate electrode GE, a first terminal ET1, and a second terminal ET2. The first terminal ET1 may be any one of the source electrode and the drain electrode, and the second terminal ET2 may be another of the source electrode and the drain electrode. In an example, in case that the first terminal ET1 is the source electrode, the second terminal ET2 may be the drain electrode.

The semiconductor layer SCL may be provided (and/or formed) on the buffer layer BFL. The semiconductor layer SCL may include a first contact region contacting the first terminal ET1 and a second contact region contacting second terminal ET2. A region which is disposed between the first contact region and the second contact region and overlaps the gate electrode GE may be a channel region of the transistor T.

The semiconductor layer SCL may be (or include) a semiconductor made of at least one semiconductor material of amorphous silicon, poly-silicon, low temperature poly-silicon, an organic semiconductor, an oxide semiconductor, or the like. The channel region may be (or include), for example, a semiconductor pattern not doped with an impurity, and may be an intrinsic semiconductor. Each of the first contact region and the second contact region may be a semiconductor pattern doped with impurities.

The gate electrode GE may be provided and/or formed on a gate insulating layer GI to correspond to the channel region of the semiconductor layer SCL. The gate electrode GE may be provided on the gate insulating layer GI, and overlap the channel region of the semiconductor layer SCL. The gate electrode GE may be formed in a single layer including at least one selected from the group consisting of copper (Cu), molybdenum (Mo), tungsten (W), aluminum neodymium (AlNd), titanium (Ti), aluminum (Al), silver (Ag), and any alloy thereof or a mixture thereof, or may be formed in a double- or multi-layered structure including molybdenum (Mo), titanium (Ti), copper (Cu), aluminum (Al) or silver (Ag), which is a low-resistance material so as to decrease wiring resistance. However, the disclosure is not limited thereto.

The gate insulating layer GI may be provided and/or formed on the semiconductor layer SCL and the buffer layer BFL. For example, the gate insulating layer GE may be entirely provided on the semiconductor layer SCL and the buffer layer BFL. The gate insulating layer GI may be an inorganic insulating layer including an inorganic material. For example, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). However, the material of the gate insulating layer GI is not limited to the above-described embodiments. In another embodiment, the gate insulating layer GI may be configured as or implemented with, for example, an organic insulating layer including an organic material. The gate insulating layer GI may be provided in a single layer, but be provided in a multi-layer including at least two layers.

Also, the pixel circuit layer PCL may include at least one insulating layer, e.g., an interlayer insulating layer ILD.

Each of the first terminal ET1 and the second terminal ET2 may be provided and/or formed on the interlayer insulating layer ILD. The first terminal ET1 and the second terminal ET2 may contact the first contact region and the second contact region of the semiconductor layer SCL through contact holes sequentially penetrating the gate insulating layer GI and the interlayer insulating layer ILD. In an example, the first terminal ET1 may be in contact with the first contact region of the semiconductor layer SCL, and the second terminal ET2 may be in contact with the second contact region of the semiconductor layer SCL. Each of the first terminal ET1 and the second terminal ET2 may include the same material as the gate electrode GE or at least one material selected from the materials that may be used to form the material forming the gate electrode GE.

The interlayer insulating layer ILD may be provided and/or formed over the gate electrode GE. For example, the interlayer insulating layer ILD may be entirely provided over the gate electrode GE. The interlayer insulating layer ILD may include the same material as the gate insulating layer GI or include at least one material selected from the materials that may be used to form the material forming the gate insulating layer GI. The interlayer insulating layer ILD may be provided in a single layer. However, the interlayer insulating layer ILD may be provided in multiple layers including at least two layers.

In an embodiment of the disclosure, the transistor T may be configured as (or implemented with), for example, a low temperature polycrystalline silicon thin film transistor (LTPS TFT), but the disclosure is not limited thereto. In another embodiment, the transistor T may be configured as an oxide semiconductor thin film transistor. Although a case where the transistor T is a thin film transistor having a top gate structure has been described as an example in the above-described embodiment, the disclosure is not limited thereto, and the structure of the transistor T may be variously change.

The transistor T may include a driving transistor for controlling a driving current of a light emitting element LD and a switching transistor electrically connected to the driving transistor. However, the disclosure is not limited thereto. In FIGS. 4 and 5, only the driving transistor for controlling the driving current of the light emitting element LD is illustrated for convenience.

The protective layer PSV may be provided and/or formed on or over a pixel circuit including the transistor T.

The protective layer PSV (also referred to as a "passivation layer" or "via layer") may be provided in a form including an organic insulating layer, an inorganic insulating layer, or the organic insulating layer disposed on the inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, polyphenylene ethers resin, poly-phenylene sulfides resin, and benzocyclobutenes resin.

The protective layer PSV may be partially opened to expose a portion of the first terminal ET1.

The display element layer DPL may be provided (and/or formed) on the protective layer PSV.

The display element layer DPL may be disposed on the pixel circuit layer PCL. The display element layer DPL may include a light emitting element LD emitting light. The light emitting element LD may be, for example, an organic light emitting diode (OLED), but the disclosure is not limited thereto. In another embodiment, the light emitting element LD may be an inorganic light emitting element including an inorganic light emitting material or a light emitting element (e.g., quantum dot display element) emitting light by changing the wavelength of light emitted from a quantum dot. The organic light emitting diode may have, for example, a form in which an anode, a hole transport layer, an organic emitting layer, an electron transport layer, and a cathode are stacked (e.g., sequentially stacked), but the disclosure is not limited thereto.

As shown in FIG. 4, the light emitting element LD may be an organic light emitting diode including a first electrode AD (or anode), an emitting layer EML, and a second electrode CD (or cathode). The light emitting element LD may emit a light among red light, green light, and blue light. However, the disclosure is not limited thereto. The first electrode AD of the light emitting element LD may be electrically connected (or coupled) to the transistor T, and the second electrode CD of the light emitting element LD may be electrically connected (or coupled) to a driving power source (not shown) through a power line (not shown).

The light emitting element LD may generate light (or beam) with a predetermined luminance corresponding to an amount of current supplied from the transistor T.

The display element layer DPL may further include a bank BNK including an opening exposing a portion of the first electrode AD, e.g., a top surface of the first electrode AD. The bank BNK may have a structure defining (or partitioning) a pixel area or emission area of each of a pixel PXL and pixels PXL adjacent thereto. The bank BNK may be, for example, a pixel defining layer. The bank BNK may be (or include) an inorganic insulating layer including an inorganic material or an organic insulating layer including an organic material. In an example, the bank BNK may be configured as or implemented with, for example, an organic insulating layer including at least one of acryl resin, epoxy resin, phenolic resin, polyamide resin, polyimide resin, etc. However, the material of the bank BNK is not limited to the above-described embodiments.

The emitting layer EML may be disposed in an area corresponding to the opening of the bank BNK. In an example, the emitting layer EML may be disposed on the exposed surface of the first electrode AD, which is exposed through the opening of the bank BNK. The emitting layer EML may have a multi-layered thin film structure including at least a light generation layer. The emitting layer EML may include a hole injection layer for injecting holes, a hole transport layer for increasing a hole recombination opportunity by suppressing movement of electrons which are excellent in transportability of holes and are not combined in a light generation layer, the light generation layer for emitting light by recombination of the injected electrons and holes, a hole blocking layer for suppressing the movement of the holes that are not combined in the light generation layer, an electron transport layer for smoothly transporting the electrons to the light generation layer, and an electron injection layer for injecting the electrons.

The first electrode AD may be electrically connected to the first terminal ET1 of the transistor T through a contact hole penetrating the protective layer PSV. The first electrode AD may include a reflective layer (not shown) capable of reflecting light or a transparent conductive layer (not shown) disposed on the top or the bottom of the reflective layer. In an example, the first electrode AD may be configured as a multi-layer including a lower transparent conductive layer made of (or including) indium tin oxide (ITO), a reflective layer which is provided on the lower transparent conductive layer and is made of silver (Ag), and an upper transparent conductive layer which is provided on the reflective layer and is made of indium tin oxide (ITO). At least one of the transparent conductive layer and the reflective layer may be electrically connected to the first terminal ET1 of the transistor T.

The second electrode CD may be provided and/or formed over the emitting layer EML.

The second electrode CD may be a common layer commonly provided (or disposed) in a pixel PXL and pixels PXL adjacent thereto, but the disclosure is not limited thereto. The second electrode CD may be (or include) a transmissive electrode, and may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as (poly(3,4-ethylene-dioxythiophene) PEDOT, a combination thereof, or the like.

A cover layer CVL may be provided and/or formed on the second electrode CD.

The cover layer CVL may be an encapsulation substrate or be provided in the form of an encapsulation layer configured as a multi-layer. In case that the cover layer CVL is provided in the form of the encapsulation layer, the cover layer CVL may include an inorganic layer and/or organic layer. For example, the cover layer CVL may have a form in which an inorganic layer, an organic layer, and an inorganic layer are stacked (e.g., sequentially stacked). The cover layer CVL may prevent external air and external moisture from infiltrating into the display element layer DPL and the pixel circuit layer PCL.

In the above-described embodiment, a case where the display element layer DPL includes the light emitting element LD configured as a top-emission organic light emitting diode, which has the first electrode AD, the emitting layer EML, and the second electrode CD, has been described as an example, but the disclosure is not limited thereto.

In another embodiment, as shown in FIG. 5, the display element layer DPL may include at least one nano-scale or micro-scale inorganic light emitting element LD (or light emitting diode) having a degree (or size) of nanometer scale (equal to or greater than 1 nm and less than 1 µm) to micrometer scale (equal to or greater than 1 µm and less than 1 mm). The nano-scale or micro-scale inorganic light emitting element LD (or light emitting diode) may be provided in a structure formed by the growth of a nitride-based semiconductor. The light emitting element LD may include a first semiconductor layer (not shown) configured as an n-type semiconductor layer, a second semiconductor layer (not shown) configured as a semiconductor layer (e.g., a p-type semiconductor layer) having a type different from that of the first semiconductor layer, and an active layer (not shown) between the first semiconductor layer and the second semiconductor layer. In an example, the light emitting element LD may be implemented as a light emitting stack structure in which the second semiconductor layer, the active layer, and the first semiconductor layer are stacked (e.g., sequentially stacked) on a surface (e.g., top surface) of the protective layer PSV. The second electrode CD may be disposed over the first semiconductor layer of the light emitting element LD.

The second semiconductor layer of the light emitting element LD may be electrically connected to the first electrode AD through first and second bonding electrodes BDE1 and BDE2. The first semiconductor layer of the light emitting element LD may be electrically connected to the second electrode CD while contacting the second electrode CD.

Figure 6:
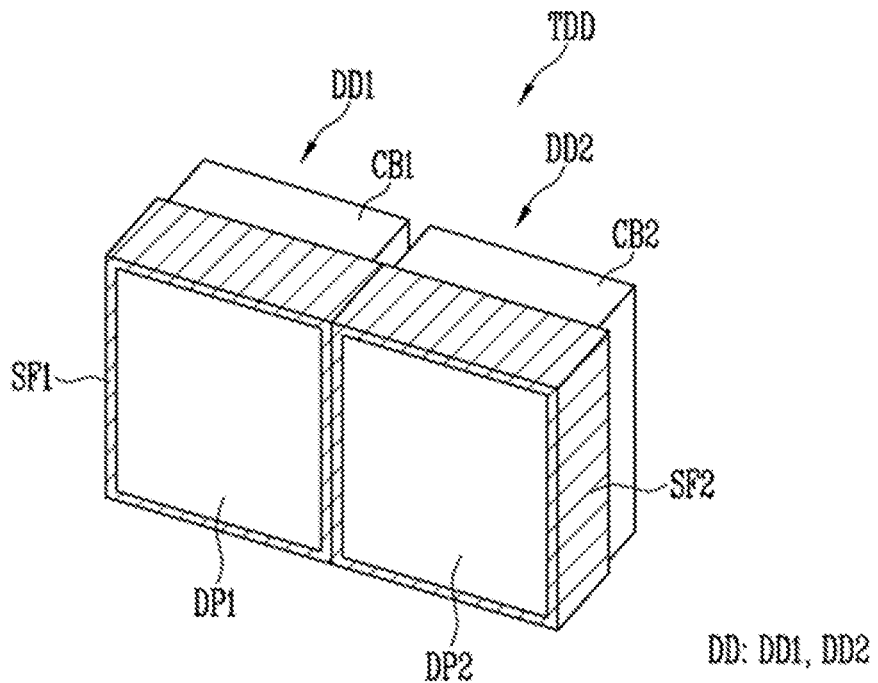
FIG. 6 is a perspective view schematically illustrating a tiling display device in accordance with an embodiment of the disclosure.
Figure 7:
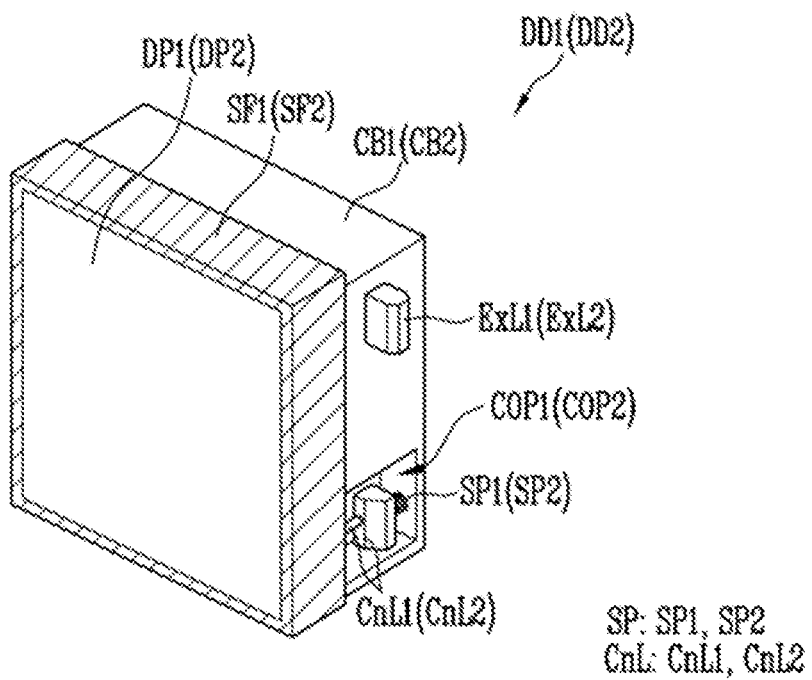
FIG. 7 is a perspective view schematically illustrating first and second display devices constituting the tiling display device shown in FIG. 6.
Figure 8:
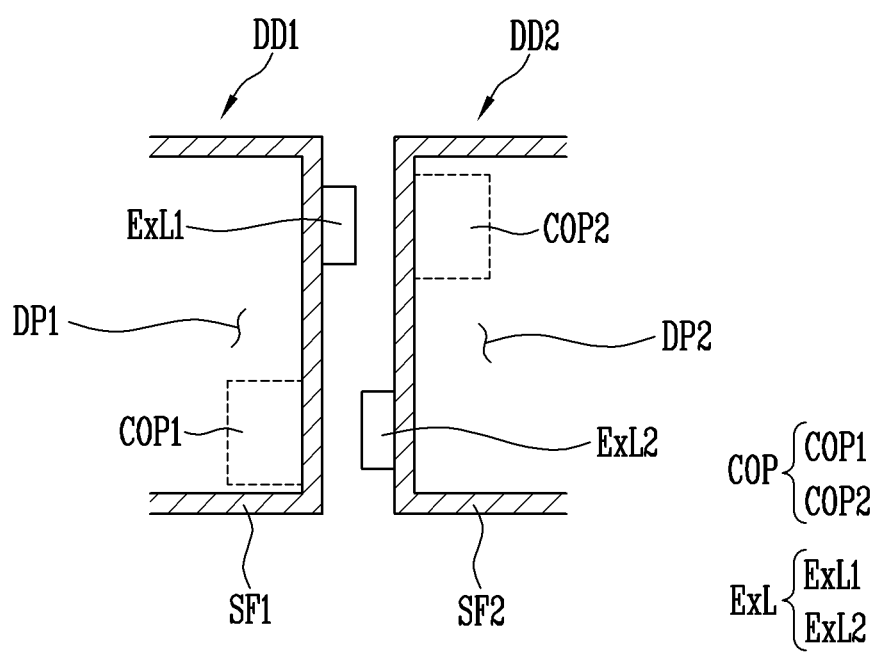
FIG. 8 is a plan view schematically illustrating a state before the first and second display devices shown in FIG. 6 are connected to each other when viewed from the top.
Figure 9:
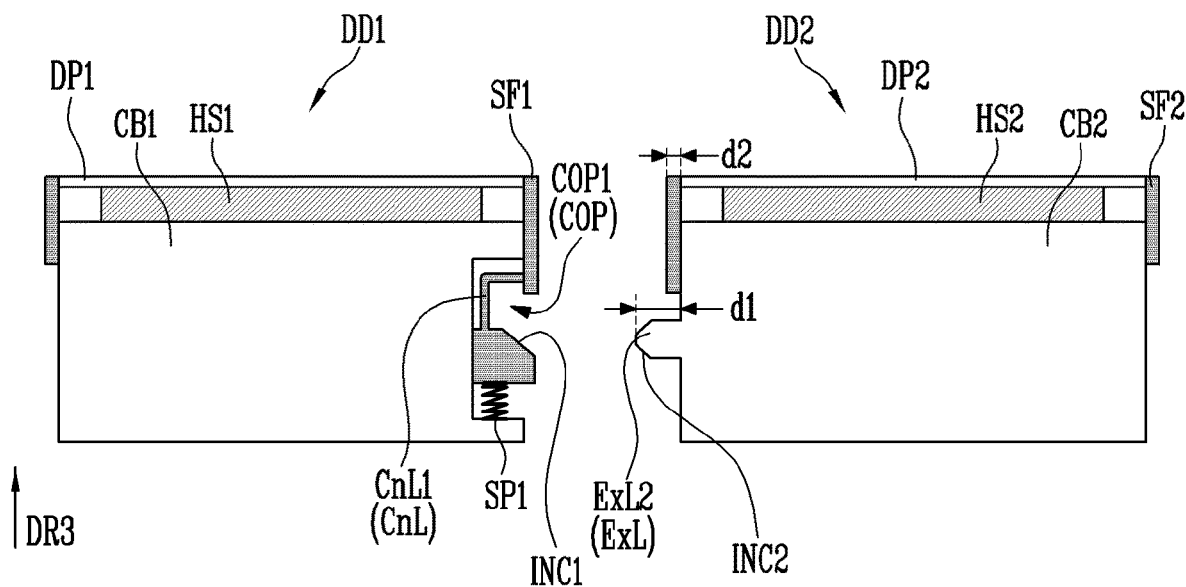
FIG. 9 is a cross-sectional view schematically illustrating the first and second display devices shown in FIG. 8.
Figure 10:
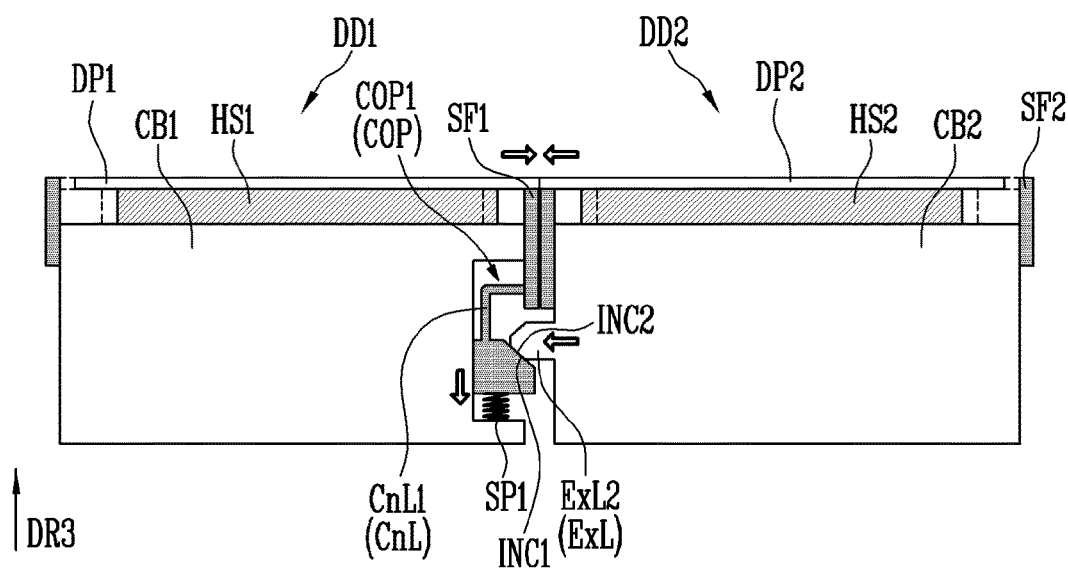
FIG. 10 is a cross-sectional view schematically illustrating a state in which the first and second display devices shown in FIG. 9 are connected to each other.

FIG. 6 is a perspective view schematically illustrating a tiling display device TDD in accordance with an embodiment of the disclosure. FIG. 7 is a perspective view schematically illustrating first and second display devices DD1 and DD2 constituting the tiling display device TDD shown in FIG. 6. FIG. 8 is a plan view schematically illustrating a state before the first and second display devices DD1 and DD2 shown in FIG. 6 are connected to each other, which is viewed from the top. FIG. 9 is a cross-sectional view schematically illustrating the first and second display devices DD1 and DD2 shown in FIG. 8. FIG. 10 is a cross-sectional view schematically illustrating a state in which the first and second display devices DD1 and DD2 shown in FIG. 9 are connected to each other.

Referring to FIGS. 6 to 10, the tiling display device TDD in accordance with the embodiment of the disclosure may include the first display device DD1 and the second display device DD2.

In FIGS. 9 and 10, for convenience of description, a thickness direction of first and second cabinets CB1 and CB2 may be designated as a third direction DR3. The third direction DR3 may be a direction (or opposite direction) indicated by the third direction DR3.

The first display device DD1 may include a first display panel DP1, a first housing HS1, the first cabinet CB1, and a first side frame SF1.

The first housing HS1 may be disposed on a surface (e.g., an upper surface) of the first display panel DP1 to control and/or fix movement of the first display panel DP1. The first display panel DP1 may be detachably fastened to the first housing HS1 through at least one fastening member (not shown). Accordingly, since the first display panel DP1 is readily detached from the first housing HS1, repair can be readily made in case that a defect occurs in one display device, e.g., the first display device DD1 in the tiling display device TDD.

In another embodiment, the first housing HS1 may be fixed and attached to the first display panel DP1. For example, the first housing HS1 may be coupled (or connected) to the first display panel DP1 by using an adhesive (or gluing) member (not shown) or the like. For example, the first housing HS1 may be integrally attached to (or may be integral with) the first display panel DP1.

The first housing HS1 may be coupled (or connected) to the first display panel DP1 and the first cabinet CB1, to enable the first display panel DP1 to be more stably and more readily handled. The first housing HS1 may be provided in a quadrangular plate shape, but the disclosure is not limited thereto. The first cabinet CB1 may be disposed on the bottom of the first housing HS1 to be coupled or connected (e.g., physically coupled or physically connected) to the first housing HS1. The first cabinet CB1 and the first housing HS1 may form (or constitute) an external set (or chassis) of the first display device DD1.

In another embodiment, the first cabinet CB1 may be detachably fastened to the first housing HS1 through at least one fastening member (not shown). Accordingly, since the first housing HS1 is readily detached from the first cabinet CB1, repair can be readily made in case that a defect occurs in a display device, e.g., the first display device DD1 in the tiling display device TDD.

The first housing HS1 may be movably connected to the first cabinet CB1 on the first cabinet CB1. For example, the first housing HS1 may be moved on the first cabinet CB1 by using a fastening structure, such as a saw-toothed wheel or a screw, which is disposed at a portion at which the first cabinet CB1 and the first housing HS1 are connected to each other. Accordingly, the first display panel DP1 disposed on the first housing HS1 may be moved, and alignment between display panels (e.g., first display panel DP1 and/or second display panel DP2) in the tiling display device TDD may be adjusted. Thus, the first display panel DP1 may be aligned with respect to the second display panel DP2 in the tiling display device TDD.

The first cabinet CB1 may be coupled or connected (e.g., physically coupled or physically connected) to the second cabinet CB2 of an adjacent display device (e.g., second display device DD2). The first cabinet CB1 and the second cabinet CB2 may be disposed on a surface (or lower surface) of the tiling display device TDD, to control or fix movement of the tiling display device TDD.

The first cabinet CB1 may include a first protrusion part ExL1 and a first concave part COP1. At least one first protrusion part ExL1 and at least one first concave part COP1 may be disposed on at least one side surface of the first cabinet CB1. In FIG. 7, a case where one first protrusion part ExL1 and one first concave part COP1 are disposed on one side surface of the first cabinet CB1 has been illustrated for convenience of description, but the present disclosure is not limited thereto. In some embodiments, each of the first protrusion part ExL1 and the first concave part COP1 may be disposed at all four side surfaces of the first cabinet CB1, and be disposed at two or more side surfaces. For example, each of the first protrusion part ExL1 and the first concave part COP1 may be disposed on at least one side surface of the first cabinet CB1.

In FIG. 7, one first protrusion part ExL1 and one first concave part COP1 are disposed on a side surface of the first cabinet CB1, but the disclosure is not limited thereto. In another embodiment, at least one first protrusion part ExL1 and at least one first concave part COP1 may be disposed on a side surface of the first cabinet CB1. For example, multiple first protrusion parts ExL1 and multiple first concave parts COP1 may be disposed on the side surfaces of the first cabinet CB1. The first protrusion parts ExL1 and the first concave parts COP1 may be alternately disposed on a side surface of the first cabinet CB1 in a direction.

The second display device DD2 may include a second display panel DP2, a second housing HS2, the second cabinet CB2, and a second side frame SF2. The second display device DD2 has a structure substantially similar or identical to the first display device DD1. Thus, descriptions of the second display device DD2 will be simplified.

The second cabinet CB2 may include at least one second protrusion part ExL2 and at least one second concave part COP2, which are disposed on a side surface thereof.

In case that the first display device DD1 and the second display device DD2 are connected (or coupled) to each other to implement a tiling display device TDD, the second protrusion part ExL2 may correspond to the first concave part COP1 of the first display device DD1, and the second concave part COP2 may correspond to the first protrusion part ExL1 of the first display device DD1.

As described above, the first display device DD1 and the second display device DD2 may be disposed side by side and adjacent to each other, and connected to each other. The first protrusion part ExL1 of the first display device DD1 may protrude toward the second concave part COP2 of the second display device DD2, and the second protrusion part ExL2 of the second display device DD2 may protrude toward the first concave part COP of the first display device DD1. For example, positions of the first protrusion part ExL1 of the first display device DD1 and the second concave part COP2 of the second display device DD2 may be adjusted, and the first protrusion part ExL1 and the second concave part COP2 may face each other. Thus, the first display device DD1 and the second display device DD2 are connected to each other, so that a tiling display device TDD may be readily implemented. For example, the first display device DD1 and the second display device DD2 may be engaged (e.g., intermeshed or interlocked) with each other.

As the first protrusion part ExL1 of the first display device DD1 protrudes toward the second concave part COP2 of the second display device DD2 and the second protrusion part ExL2 of the second display device DD2 protrudes toward the first concave part COP of the first display device DD1, the first protrusion part ExL1 may be moved to the inside of the second concave part COP2 and the second protrusion part ExL2 may be moved to the inside of the first concave part COP1, in case that the first display device DD1 and the second display device DD2 are connected (or coupled) to each other. Thus, the first display device DD1 and the second display device DD2 may be coupled (or connected) to each other, and the tiling display device TDD may be implemented.

In the following embodiment, in case that the first concave part COP1 and the second concave part COP2 are inclusively designated, each of the first and second concave parts COP1 and COP2 or the first and second concave parts COP1 and COP2 are referred to as a concave part COP or concave parts COP. In case that the first protrusion part ExL1 and the second protrusion part ExL2 are inclusively designated, each of the first and second protrusion parts ExL1 and ExL2 or the first and second protrusion parts ExL1 and ExL2 are referred to as a protrusion part ExL or protrusion parts ExL.

A connection part CnL and a control part may be disposed in the concave part COP. In an example, a first connection part CnL1 and a first control part SP1 may be disposed in the first concave part COP1, and a second connection part CnL2 and a second control part SP2 may be disposed in the second concave part COP2.

In an embodiment, a portion of the first side frame SF1 may extend to the first concave part COP1, and a portion of the second side frame SF2 may extend to the second concave part COP2.

The first side frame SF1 may be disposed on a side surface of the first display panel DP1. The first side frame SF1 may be moved (or movable) in a direction parallel to the third direction DR3 (e.g., upper and lower directions). The first side frame SF1 may be disposed only on some of the four side surfaces of the first display panel DP1. For example, the first side frames SF1 may be disposed on all the four side surfaces of the first display panel DP1. The first side frames SF1 disposed on the respective side surfaces may be differently (or independently) moved. For example, the first side frames SF1 may be equally moved.

The first side frame SF1 may cover (or overlap) the first display panel DP1, and protect the first display panel DP1. For example, the first side frame SF1 may cover the first display panel DP1 and at least one of the first housing HS1 and the first cabinet CB1. Thus, the first display device DD1 may be protected from external impact, friction, etc., and damage of the first display device DD1 may be minimized.

The first connection part CnL1 may be connected to the first side frame SF1 and the first control part SP1.

The first connection part CnL1 may be fastened to the first control part SP1 to move together with the first control part SP1 according to movement of the first control part SP1. For example, the first connection part CnL1 may be moved (or movable) in a direction parallel to the third direction DR3. The first connection part CnL1 may be connected to the first side frame SF1 to move together with the first side frame SF1.

The first control part SP1 may be fastened to the first connection part CnL1 to control movement of the first connection part CnL1. The first control part SP1 may include a material having elasticity. For example, the first control part SP1 may include a spring, but the disclosure is not limited thereto. The first control part SP1 may include at least one spring. The first control part SP1 may be fastened to a surface (e.g., a lower surface) in the first concave part COP1, but the disclosure is not limited thereto. Also, the first control part SP1 may be connected to the first connection part CnL1. Since the first control part SP1 is made of the elastic material, the first connection part CnL1 and the first side frame SF1 may be readily moved according to a force applied to the first control part SP1. In an example, in case that a predetermined force is applied to the first control part SP1, the first control part SP1 may be moved to the lower surface of the first concave part COP1, and the first connection part CnL1 and the first side frame SF1 may be moved downwardly in the third direction DR3. Also, in case that the force applied to the first control part SP1 is removed, the first control part SP1 may be returned to (or recover) an original state, and therefore, the first connection part CnL1 and the first side frame SF1 may also be moved to original positions thereof.

The first connection part CnL1 may include a first inclined surface INC1. The second protrusion part ExL2 may include a second inclined surface INC2.

The first inclined surface INC1 and the second inclined surface INC2 may be disposed to correspond to each other to allow the first display device DD1 and the second display device DD2 to be readily coupled (or connected) to each other. For example, the first inclined surface INC1 may contact (e.g., slidably contact) the second inclined surface INC2 in case that the second protrusion part ExL2 is pressed toward the first connection part CnL1. The second protrusion part ExL2 including the second inclined surface INC2 may contact the first connection part CnL1 including the first inclined surface INC1 and apply a predetermined force to the first inclined surface INC1 of the first connection part CnL1. The first control part SP1 may be moved (or movable) in a direction parallel to one direction, e.g., the third direction DR3. The first control part SP1 to be readily moved in one direction (e.g., third direction DR3) by the first inclined surface INC1 and the second inclined surface NC2. In case that the first part SP1 is moved, the first connection part CnL1 and the first side frame SF1 connected thereto may also be moved together. A moving distance of the first connection part CnL1 and the first side frame SF1 may be smaller than a thickness of the first concave part COP1 in the third direction DR3.

A width d1 of the second protrusion part ExL2 may be greater than a width d2 of the second side frame SF2. In an embodiment, the second protrusion part ExL2 may be (or include) a portion of the second cabinet CB2, which protrudes in a direction toward the first concave part COP1 from a side surface of the second cabinet CB2, and the width d1 of the second protrusion part ExL2 may mean a degree to which the second protrusion part ExL2 protrudes from the side surface of the second cabinet CB2. Since the width d1 of the second protrusion part ExL2 is greater than width d2 of the second side frame SF2, the second protrusion part ExL2 may first contact the first control part SP1 of the first concave part COP1 before the second side frame SF2 contacts the first side frame SF1. For example, in case that the second protrusion part ExL2 is moved toward the first connection part CnL1, a force may be applied to the first inclined surface INC1 of the first connection part CnL1 and movement of the first connection part CnL1 may be restricted by the first concave part COP1 and/or the first side frame SF1. Thus, a predetermined force may be applied to the first control part SP1 in the third direction DR3. Accordingly, the first connection part CnL1 connected to the first control part SP1 and the first side frame SF1 may be moved toward the lower surface of the first concave part COP1 (or the first cabinet CB).

Although not directly shown in the drawings, the second control part SP2 in the second concave part COP2 may be moved toward a lower surface of the second concave part COP2 (or the second cabinet CB2) while the first protrusion part ExL1 is moved to the second concave part COP2. The second connection part CnL2 connected to the second control part SP2 and the second side frame SF2 may be moved toward the lower surface of the second concave part COP2 (or the second cabinet CB2).

As described above, in case that the first concave part COP1 of the first cabinet CB1 and the second protrusion part ExL2 of the second cabinet CB2 are coupled to each other while being engaged with each other, the first display panel DP1 and the second display panel DP2 may be moved in arrow directions shown in FIG. 10 by using the first housing HS1 and the second housing HS2. In an example, the first and second display panels DP1 and DP2 may be moved by using separate fastening members (e.g., saw-toothed wheels, screws, etc.) disposed between the first cabinet CB1 and the first housing HS1 and between the second cabinet CB2 and the second housing HS2, respectively, such that the first display panel DP1 and the second display panel DP2 are disposed adjacent to each other.

As the first side frame SF1 is moved toward the lower surface of the first concave part COP1 (or the first cabinet CB1) and the second side frame SF2 is moved toward the lower surface of the second concave part COP2 (or the second cabinet CB2), the first display panel DP1 and the second display panel DP2 may be disposed immediately adjacent to each other, thereby decreasing a distance between the first display panel DP1 and the second display panel DP2. Accordingly, in the tiling display device TDD, the visibility of a boundary portion between the first display device DD1 and the second display device DD2 is minimized, and thus an image having improved quality can be displayed.

On the contrary to the sequence described above, the connection between the first display device DD1 and the second display device DD2 may be released. By the control part SP including the material having elasticity, each of the first and second side frames SF1 and SF2 may be returned to an original state by being moved in a direction opposite to that in which each of the first and second side frames SF1 and SF2 was moved. Thus, each of the first and second display devices DD1 and DD2 can be used as an independent (or individual) display device DD without constituting the tiling display device TDD.

Figure 11:
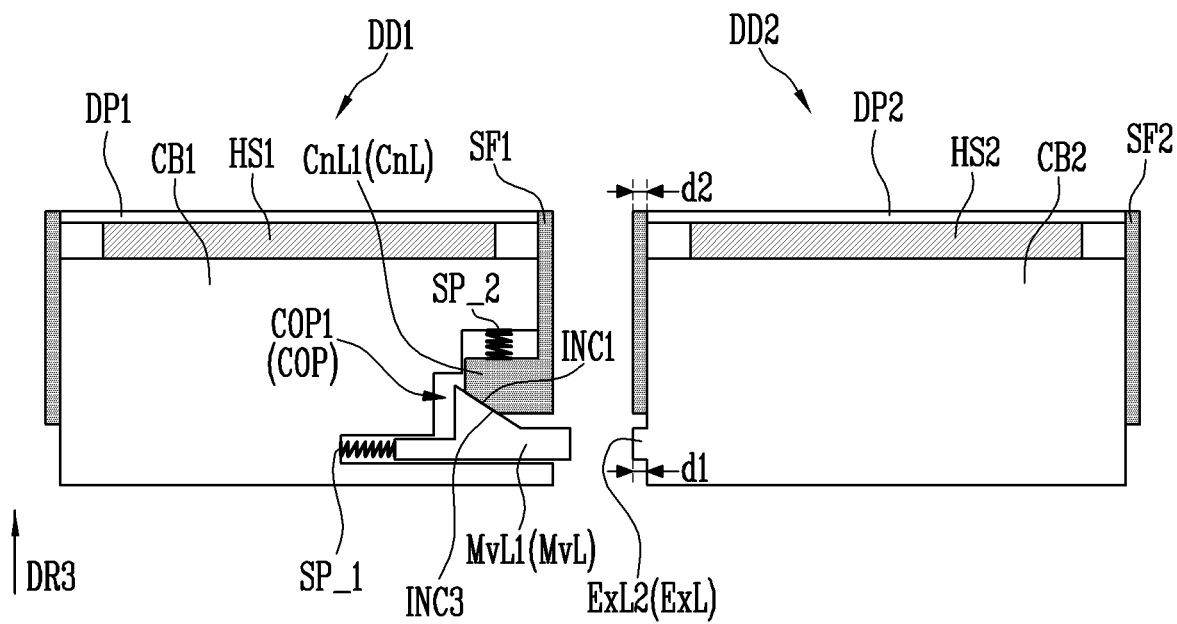
FIG. 11 is a cross-sectional view schematically illustrating first and second display devices before the first and second display devices are connected to each other in accordance with another embodiment of the disclosure.
Figure 12:
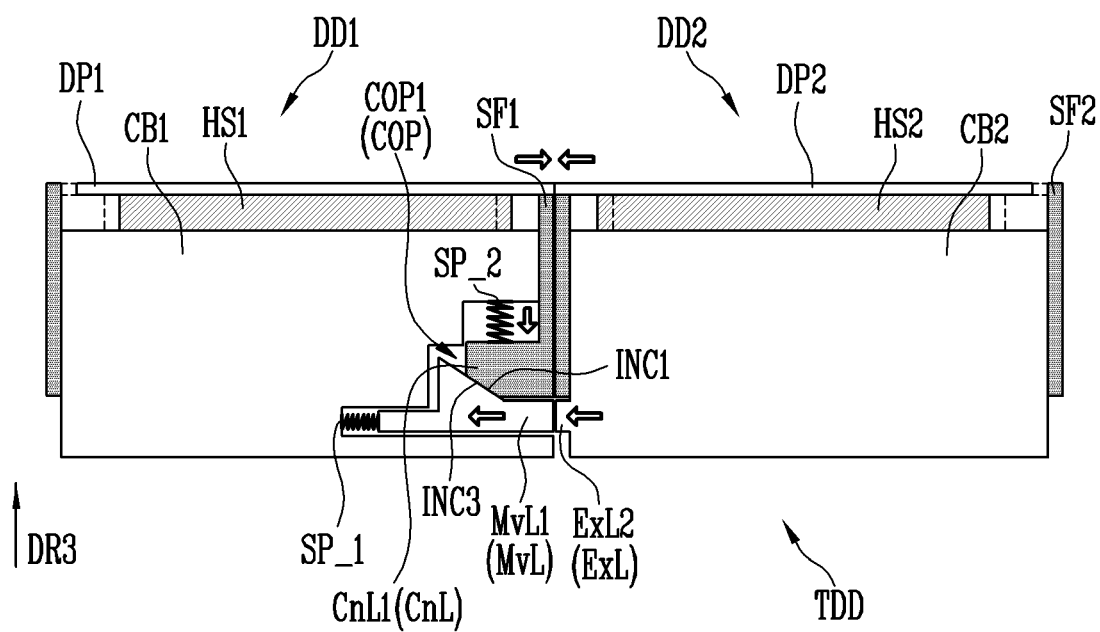
FIG. 12 is a cross-sectional view schematically illustrating a tiling display device in which the first and second display devices shown in FIG. 11 are connected to each other.

FIG. 11 is a cross-sectional view schematically illustrating first and second display devices DD1 and DD2 before the first and second display devices DD1 and DD2 are connected to each other in accordance with another embodiment of the disclosure. FIG. 12 is a cross-sectional view schematically illustrating a tiling display device TDD in which the first and second display devices DD1 and DD2 shown in FIG. 11 are connected to each other.

In relation to the first and second display devices DD1 and DD2 shown in FIGS. 11 and 12, portions different from those of the above-described embodiment will be mainly described to avoid redundancy. Portions not particularly described in the embodiment shown in FIGS. 11 and 12 may follow those of the above-described embodiment. Identical reference numerals refer to identical components, and similar reference numerals refer to similar components.

Referring to FIGS. 11 and 12, the first display device DD1 may include a first display panel DP1, a first housing HS1, a first cabinet CB1, and a first side frame SF1. The first cabinet CB1 may include a first concave part COP1.

The second display device DD2 may include a second display panel DP2, a second housing HS2, a second cabinet CB2, and a second side frame SF2. The second cabinet CB2 may include a second protrusion part ExL2.

A first moving part MvL1, a first connection part CnL1, a first control part SP_1, and a second control part SP_2 may be included (or disposed) in the first concave part COP1.

The first moving part MvL1 may be connected to the first control part SP_1. The first moving part MvL1 may be fastened to the first control part SP_1 to be moved (or movable) together with the first control part SP_1 in case that the first control part SP_1 is moved. For example, the first moving part MvL1 may be moved in a direction perpendicular to the third direction DR3.

The first control part SP_1 may be fastened (or connected) to the first moving part MvL1 to control movement of the first moving part MvL1. The first control part SP_1 may include a material having elasticity. For example, the first control part SP_1 may include a spring, but the disclosure is not limited thereto. The first control part SP_1 may be fastened to a surface (e.g., a side surface) of the first concave part COP1, to be connected to the first moving part MvL1.

The first moving part MvL1 may include a third inclined surface INC3.

The first moving part MvL1 may protrude to the outside of the first cabinet CB1 or the first side frame SF1. Since the first moving part MvL1 protrudes to the outside of the first cabinet CB1 or the first side frame SF1, the second protrusion part ExL2 may contact the first moving part MvL1 before the second side frame SF2 contacts the first side frame SF1, thereby readily applying a force to the first moving part MvL1. Accordingly, the first display device DD1 and the second display device DD2 may be readily connected (or coupled) to each other.

The first connection part CnL1 may be fastened to the second control part SP_2, and moved (or movable) together with the second control part SP_2 in case that the second control part SP_2 is moved. For example, the first connection part CnL1 may be moved in a direction parallel to the third direction DR3. The first connection part CnL1 may be connected to the first side frame SF1 and moved (or movable) together with the first side frame SF1.

The second control part SP_2 may be fastened to the first connection part CnL1 to control movement of the first connection part CnL1. The second control part SP_2 may include a material having elasticity. For example, the second control part SP_2 may include a spring, but the disclosure is not limited thereto. The second control part SP_2 may be fixed to a surface (e.g., upper surface) of the first concave part COP1, and be fastened to the first connection part CnL1. The second control part SP_2 may control movement of the first connection part CnL1 and the first side frame SF1 according to movement of the first control part SP_1 (or according to whether a force is applied to the first control part SP_1).

The first control part CnL1 may include a first inclined surface INC1.

The first inclined surface INC1 and the third inclined surface INC3 may be disposed to correspond to each other. For example, the first inclined surface INC1 may contact (e.g., slidably contact) the third inclined surface INC3. Therefore, in case that the first moving part MvL1 is moved, the first connection part CnL1 may be moved together with the first moving part MvL1.

Although a case where the second protrusion part ExL2 has a rectangular shape is illustrated in FIGS. 11 and 12, the disclosure is not limited thereto, and the second protrusion part ExL2 may also include an inclined surface, or the like.

A width d1 of the second protrusion part ExL2 may be equal to a width d2 of the second side frame SF2. The second protrusion part ExL2 is designed such that the width d1 of the second protrusion part ExL2 is equal to the width d2 of the second side frame SF2. Thus, a distance between the first display device DD1 and the second display device DD2 may be decreased or eliminated.

In case that the first display device DD1 and the second display device DD2 are connected (or coupled) to each other, the first cabinet CB1 and/or the second cabinet CB2 may be moved such that the second protrusion part ExL2 corresponds to the first moving part MvL1. The second protrusion part ExL2 may be moved to the first moving part MvL1, thereby applying a predetermined force to the first moving part MvL1. The first control part SP_1 may be moved in one direction, e.g., a direction perpendicular to the third direction DR3.

In case that the first moving part MvL1 is moved, the first connection part CnL1 and the second control part SP_2 may be moved in another direction different from the one direction, e.g., a direction parallel to the third direction DR3.

Figure 13:
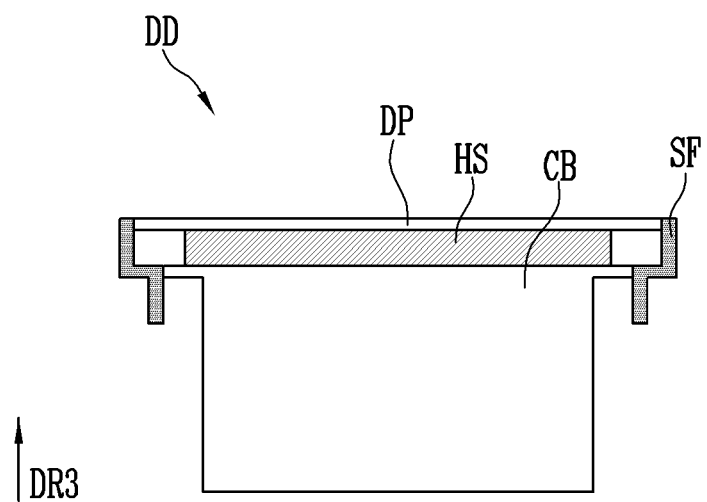
FIG. 13 is a cross-sectional view schematically illustrating a display device in accordance with still another embodiment of the disclosure.
Figure 14:
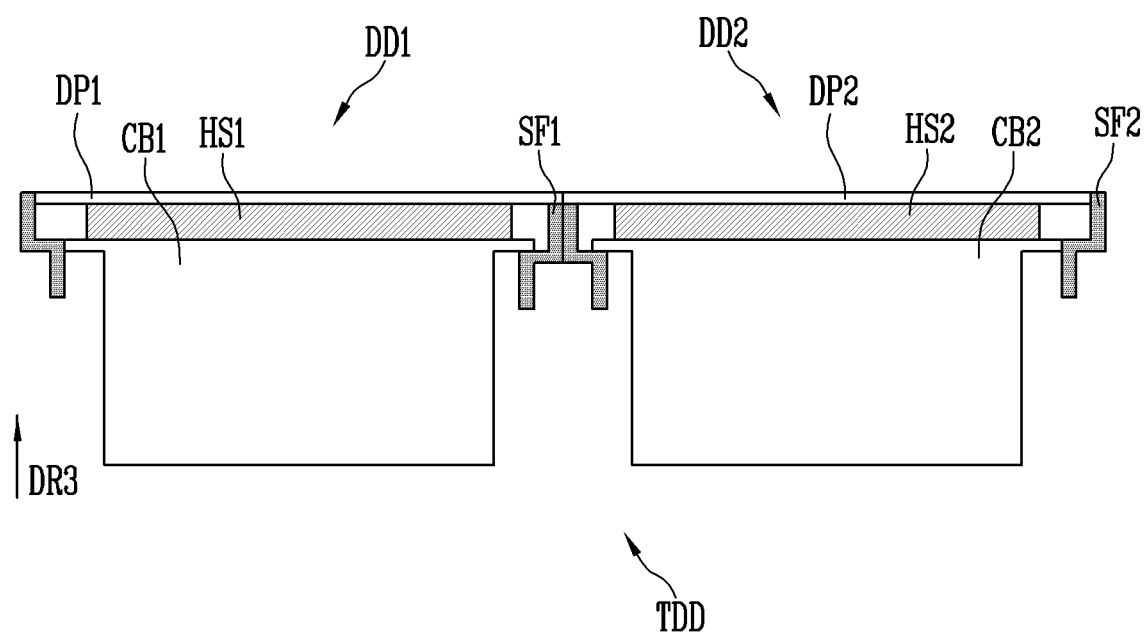
FIG. 14 is a cross-sectional view schematically illustrating a tiling display device including multiple display devices shown in FIG. 13 connected to each other.

FIG. 13 is a cross-sectional view schematically illustrating a display device DD in accordance with still another embodiment of the disclosure. FIG. 14 is a cross-sectional view schematically illustrating a tiling display device TDD in which multiple display devices DD shown in FIG. 13 is connected.

Referring to FIG. 13, the display device DD in accordance with the embodiment of the disclosure may include a display panel DP, a housing HS, a cabinet CB, and a side frame SF.

The side frame SF may have a stepped shape.

The cabinet CB may be smaller than the display panel DP, and include a portion having a shape corresponding to the side frame SF having the stepped shape.

Therefore, referring to FIG. 14, in case that the first display device DD1 and the second display device DD2 are connected to each other, first and second side frames SF1 and SF2 may be moved (or movable) in one direction and also in another direction different from the one direction, e.g., in both directions parallel and perpendicular to the third direction DR3.

Thus, after the first display device DD1 and the second display device DD2 are connected to each other, first and second display panels DP1 and DP2 may be connected to each other without any gap between the first and second display panels DP1 and DP2, even in case that the first and second display panels DP1 and DP2 and first and second housings HS1 and HS2 are not moved.

Figure 15:
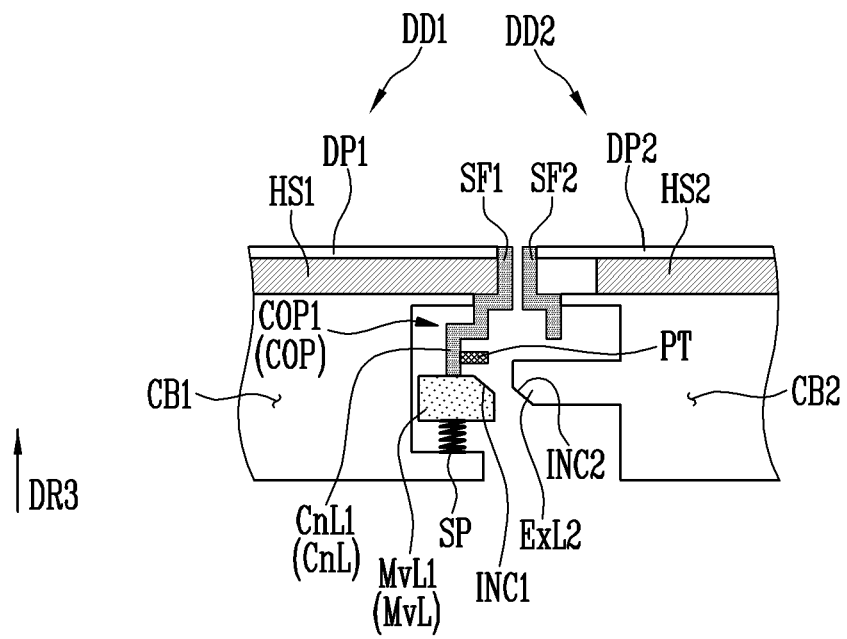
FIG. 15 is a cross-sectional view schematically illustrating display devices before the display devices are connected to each other in accordance with still another embodiment of the disclosure.
Figure 16:
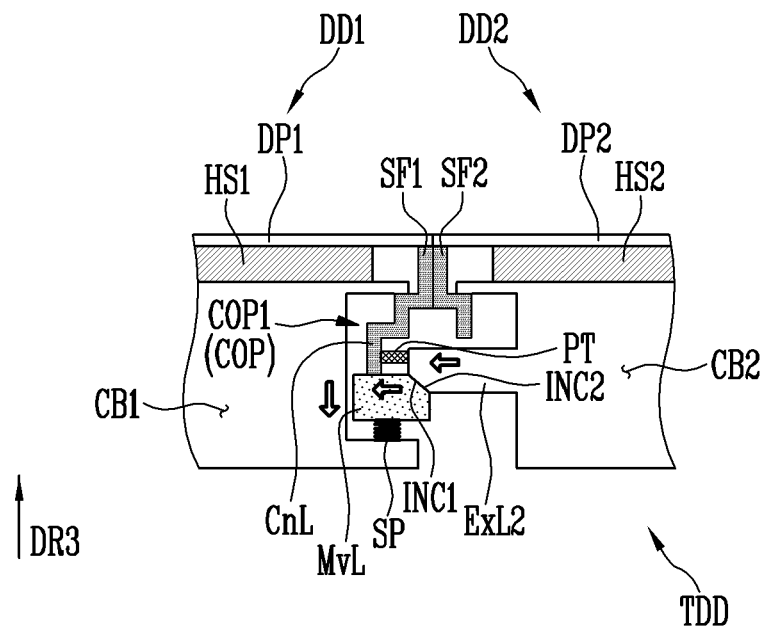
FIG. 16 is a cross-sectional view schematically illustrating a tiling display device in which the display devices shown in FIG. 15 are connected to each other.

FIG. 15 is a cross-sectional view schematically illustrating first and second display devices DD1 and DD2 before the first and second display devices DD1 and DD2 are connected to each other in accordance with still another embodiment of the disclosure. FIG. 16 is a cross-sectional view schematically illustrating a tiling display device TDD in which the first and second display devices DD1 and DD2 shown in FIG. 15 are connected to each other.

With regard to the first and second display devices DD1 and DD2 shown in FIGS. 15 and 16, portions different from those of the above-described embodiment will be mainly described to avoid redundancy. Portions not particularly described in the embodiment shown in FIGS. 15 and 16 may follow those of the above-described embodiment. Identical reference numerals refer to identical components, and similar reference numerals refer to similar components.

Referring to FIGS. 15 and 16, the first display device DD1 may include a first display panel DP1, a first housing HS1, a first cabinet CB1, and a first side frame SF1, and the first cabinet CB1 may include a first concave part COP1.

The second display device DD2 may include a second display panel DP2, a second housing HS2, a second cabinet CB2, and a second side frame SF2, and the second cabinet CB2 may include a second protrusion part ExL2.

A connection part CnL, a moving part MvL, and a control part SP may be included in the first concave part COP, and a portion of the first side frame SF1 may extend to the first concave part COP1.

The connection part CnL may be connected to the first side frame SF1 and the moving part MvL. The connection part CnL may not be fixed (or attached) to the moving part MvL, but may be movably fastened (or connected) to the moving part MvL. The connection part CnL may be moved by using a separate fastening member (not shown) (e.g., a saw-toothed wheel, a screw, or the like). For example, the fastening member (not shown) may be disposed between the connection part CnL and the moving part MvL.

Also, the connection part CnL may include a protruding part PT. Since the connection part CnL includes the protruding part PT, the connection part CnL may readily receive a predetermined force in case that the connection part CnL is in contact with the second protrusion part ExL2. For example, a portion of the force formed by pressing the second protrusion part ExL2 toward the first connection part CnL1 may be applied to the first connection part CnL1 through the protruding part PT.

The moving part MvL may include a first inclined surface INC1. The second protrusion part ExL2 may include a second inclined surface INC2.

The first inclined surface INC1 and the second inclined surface INC2 may be disposed to correspond to each other, so that the first display device DD1 and the second display device DD2 may be readily coupled (or connected) to each other. The second protrusion part ExL2 including the second inclined surface INC2 may contact (e.g., slidably contact) the moving part MvL including the first inclined surface INC1, thereby forming pressure fastening.

The pressure fastening may include that in case that the first display device DD1 and the second display device DD2 are connected to each other, a predetermined force is applied to the connection part CnL or the moving part MvL by allowing the second protrusion part ExL2 to contact the connection part CnL or the moving part MvL, so that the control part SP is moved in a direction parallel to the third direction DR3 or a direction perpendicular to the third direction DR3. Thus, the first display device DD1 may be connected to the second display device DD2 by the pressure fastening.

In case that the first display device DD1 and the second display device DD2 are connected to each other, the second protrusion part ExL2 may be disposed to correspond to the moving part MvL and the protruding part PT and move to the moving part MvL. The control part SP may be moved (or movable) in a direction (e.g., direction parallel to the third direction DR3). The connection part CnL may be moved (or movable) in one direction, and simultaneously, be moved in another direction different from the one direction (e.g., direction perpendicular to third direction DR3). For example, the first connection part CnL1 may be moved (or movable) in the directions (e.g., both directions parallel and perpendicular to third direction DR3).

In case that the control part SP and the connection part CnL are moved as described above, the first side from SF1 connected to the connection part CnL may be moved in one direction but also in another direction different from the one direction, e.g., in both directions parallel and perpendicular to the third direction DR3.

Thus, after the first display device DD1 and the second display device DD2 are connected to each other, the first and second display panels DP1 and DP2 may be connected to each other without any gap between the first and second display panels DP1 and DP2, even in case that the first and second display panels DP1 and DP2 and the first and second housings HS1 and HS2 are not moved.

Display devices DD may be engaged with each other, for example, in the first direction DR1, to implement one tiling display device TDD. As described above, the gap between the first display panel DP1 and the second display panel DP2 may be minimized or substantially eliminated. In addition, a boundary area between the first display panel DP1 and the second display panel DP2, particularly, the first side frame SF1 and the second side frame SF2 as instruments for protecting the first display device DD1 or the second display device DD2 in case that the first display device DD1 or the second display device DD2 is independently used are moved to the bottom of the first display panel DP1 and the second display panel DP2, so that viewing of an area of the first side frame SF1 as a protection device of the first display device DD1 and an area of the second side frame SF2 as a protection device of the second display device DD2 in the tiling display device TDD can be prevented or reduced. Accordingly, more natural image can be displayed even in the boundary area. That is, in the present disclosure, the breakoff of an image displayed on a screen of the tiling display device TDD is reduced, and a more natural screen is implemented, so that the quality of an image can be improved.

In accordance with the disclosure, there may be provided a display device in which, since a vertically movable side frame is applied, a display panel is readily manipulated in case that the display device is independently used, and visibility is increased in case that the display device forms a tiling display device. For example, there can be provided a display device which can be independently use, and also be used to form a tiling display device when the display device is connected in plurality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and detail may be made without departing from the spirit and scope of the disclosure.

What is claimed is:
1. A display device comprising:
a first display panel having a first main surface upon which an image is displayed, a second main surface opposite the first main surface, and a first side surface connecting the first main surface to the second main surface;
a first housing disposed on a bottom of the first display panel;
a first cabinet having a first side facing toward the first housing, a back side facing away from the first housing, and a side surface between the first side and the back side, the first cabinet disposed on a bottom of the first housing, the first cabinet including:
a first protrusion part; and
a first concave part that includes a connection part and a control part; and a first side frame disposed on the first side surface of the first display panel,
a second display panel disposed adjacent to the first display panel;
a second housing disposed on a bottom of the second display panel;
a second cabinet having a first side facing toward the second housing, a back side facing away from the second housing, and a side surface between the first side and the back side, the second cabinet disposed on a bottom of the second housing, the second cabinet including a second protrusion part;
at least one second protrusion part disposed on at least the side surface of the second cabinet,
wherein
the first side frame is movable toward the back side of the first cabinet,
a portion of the first side frame extends to the first concave part,
the connection part is connected to the first side frame and movable in a direction,
the connection part includes an inclined surface corresponding to the second protrusion part, and
the control part is fastened to the connection part to control movement of the connection part.

2. The display device of claim 1, further comprising:
a second side frame disposed on the side surface of the second display panel, wherein
the second display panel has a third main surface upon which an image is displayed, a fourth main surface opposite the first main surface, and a second side surface connecting the first main surface to the second main surface,
the second cabinet includes a second concave part,
the second side frame is movable toward the back side of the second cabinet, and
a portion of the second side frame extends to the second concave part.

3. The display device of claim 2, wherein
the first side frame covers the side surface of the first display panel and protects the first display panel, and
the second side frame covers the side surface of the second display panel and protects the second display panel.

4. The display device of claim 2, wherein
at least one first protrusion part and at least one first concave part are disposed on at least the side surface of the first cabinet, and
at least one second concave part is disposed on at least the side surface of the second cabinet.

5. The display device of claim 4, wherein the control part includes a spring having elasticity.

6. The display device of claim 5, wherein
the first protrusion part protrudes toward the second concave part, and
the second protrusion part protrudes toward the first concave part.

7. The display device of claim 6, wherein in case that the first display panel and the second display panel are connected to each other,
the first protrusion part is moved to an inside of the second concave part, and
the second protrusion part is moved to an inside of the first concave part.

8. The display device of claim 7, wherein in case that the first display panel and the second display panel are connected to each other, the second protrusion part moves to the first concave part, contacts the inclined surface of the connection part, and applies a force to the control part such that the control part is moved in the direction.

9. The display device of claim 8, wherein in case that the first display panel and the second display panel are connected to each other, each of the first and second side frames is moved toward a corresponding one of the first and second cabinets.

10. The display device of claim 1, wherein a thickness of the second protrusion part is greater than that of the second side frame.

* * * * *